US012701749B2

(12) United States Patent
Kim

(10) Patent No.: US 12,701,749 B2
(45) Date of Patent: Aug. 4, 2026

(54) TRANSISTOR, FABRICATION METHOD THEREOF, AND DISPLAY APPARATUS COMPRISING THE SAME

(71) Applicant: LG Display Co., Ltd., Seoul (KR)

(72) Inventor: Jaehyun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 295 days.

(21) Appl. No.: 18/240,313

(22) Filed: Aug. 30, 2023

(65) Prior Publication Data

US 2024/0213369 A1 Jun. 27, 2024

(30) Foreign Application Priority Data

Dec. 26, 2022 (KR) ........................ 10-2022-0183940

(51) Int. Cl.
*H10D 30/67* (2025.01)
*H10D 99/00* (2025.01)
*H10W 90/00* (2026.01)

(52) U.S. Cl.
CPC ..... *H10D 30/6758* (2025.01); *H10D 30/6728* (2025.01); *H10D 30/6735* (2025.01); *H10D 30/6755* (2025.01); *H10D 30/6757* (2025.01); *H10D 99/00* (2025.01); *H10W 90/00* (2026.01)

(58) Field of Classification Search
None
See application file for complete search history.

(56) References Cited

U.S. PATENT DOCUMENTS

| | | | | |
|---|---|---|---|---|
| 7,446,025 | B2 * | 11/2008 | Cohen | ................. H10D 62/118 |
| | | | | 977/762 |
| 8,847,395 | B2 * | 9/2014 | Ernst | ................... H10W 20/057 |
| | | | | 257/E51.023 |
| 8,872,221 | B2 * | 10/2014 | Lee | ................... H10D 30/6728 |
| | | | | 257/E29.262 |
| 8,975,689 | B1 | 3/2015 | Kim et al. | |
| 10,121,877 | B1 * | 11/2018 | Hook | .................. H10D 30/025 |
| 2006/0125025 | A1 | 6/2006 | Kawashima et al. | |
| 2014/0167048 | A1 * | 6/2014 | Lee | ...................... H10K 10/491 |
| | | | | 438/156 |
| 2015/0090951 | A1 | 4/2015 | Kim et al. | |
| 2019/0296155 | A1 * | 9/2019 | Sawabe | ............. H10D 30/6757 |
| 2020/0111917 | A1 * | 4/2020 | Ramaswamy | ..... H10D 30/6728 |
| 2020/0410926 | A1 * | 12/2020 | Li | .......................... G09G 3/325 |

(Continued)

FOREIGN PATENT DOCUMENTS

| | | |
|---|---|---|
| KR | 10-2006-0012724 A | 2/2006 |
| KR | 10-2015-0037168 A | 4/2015 |
| KR | 10-2021-0085523 A | 7/2021 |

*Primary Examiner* — Nishath Yasmeen
(74) *Attorney, Agent, or Firm* — Fenwick & West LLP

(57) ABSTRACT

A transistor, a fabricating method of the transistor, and a display apparatus comprising the transistor are provided. The transistor comprises a first electrode, nanorod on the first electrode, an active layer on the nanorod, a gate insulating layer on the active layer, a gate electrode on the active layer, and a second electrode connected to the active layer and disposed spaced apart from the first electrode, first electrode has a pattern area, the nanorod is disposed on the pattern area, the nanorod has a diameter and height, the height of the nanorod is larger than the diameter of the nanorod, the active layer is disposed on a side surface of the nanorod, and connected to the first electrode.

19 Claims, 13 Drawing Sheets

(56)                References Cited

U.S. PATENT DOCUMENTS

| | | | |
|---|---|---|---|
| 2021/0074713 A1* | 3/2021 | Moriwaki | H10B 20/40 |
| 2022/0059031 A1* | 2/2022 | Kim | G09G 3/3233 |
| 2023/0045618 A1* | 2/2023 | Kim | H10H 20/8312 |

* cited by examiner

TRANSISTOR, FABRICATION METHOD THEREOF, AND DISPLAY APPARATUS COMPRISING THE SAME

CROSS-REFERENCE TO RELATED APPLICATIONS

This application claims priority from Korean Patent Application No. 10-2022-0183940 filed on Dec. 26, 2022, which is hereby incorporated by reference as if fully set forth herein.

BACKGROUND

Field of the Invention

The present disclosure relates to a transistor, a manufacturing method thereof, and a display apparatus including the transistor.

Discussion of the Related Art

Transistors are widely used as switching devices or driving devices in the field of electronic apparatuses. In particular, since a thin film transistor can be manufactured on a glass substrate or a plastic substrate, the thin film transistor is widely used as a switching device of a display apparatus such as a liquid crystal display apparatus or an organic light emitting apparatus.

An oxide constituting an active layer of an oxide semiconductor thin film transistor may be grown at a relatively low temperature, and the oxide semiconductor thin film transistor has high mobility, and has a large resistance change in accordance with an oxygen content, whereby desired properties may be easily obtained. Further, in view of the properties of the oxide, since an oxide semiconductor is transparent, it is favorable to embody a transparent display.

As display devices have recently become high-resolution, it is necessary to place a large number of thin film transistors in a narrow area. Therefore, research is being conducted on a technology for reducing the area of thin film transistors or efficiently arranging thin film transistors.

In addition, transistor devices of various structures and sizes are included in the display, and relatively high current levels are required in some transistors. In particular, a much higher current level is required in micro LEDs. However, in obtaining a high current level, there is a limit to the area allowed. Therefore, research is being conducted to arrange a large number of transistors in a narrow area.

SUMMARY

The present disclosure has been made in view of the above problems and it is an object of the present disclosure to provide a transistor capable of allowing high current to flow while occupying a small area.

In order to occupy a small area and allow high current to flow, a transistor to which a nanorod is applied is provided.

It is another object of the present disclosure to provide a transistor capable of adjusting an amount of current by adjusting the number of nanorods. Accordingly, an embodiment of the present disclosure is to provide a method of designing various transistors suitable for use by adjusting the number of nanorods.

It is another object of the present disclosure to provide a display apparatus including such a transistor.

It is another object of the present disclosure to provide a method of manufacturing such a transistor.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a transistor and a fabricating method thereof comprising a first electrode, nanorod on the first electrode, an active layer on the nanorod, a gate insulating layer on the active layer, a gate electrode on the active layer, and a second electrode connected to the active layer and disposed spaced apart from the first electrode, the first electrode has a pattern area, the nanorod is disposed on the pattern area, the nanorod has a diameter and height, the height of the nanorod is larger than the diameter of the nanorod, the active layer is disposed on a side surface of the nanorod, and connected to the first electrode. In addition, an embodiment of the present disclosure provides a display apparatus including the transistor.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
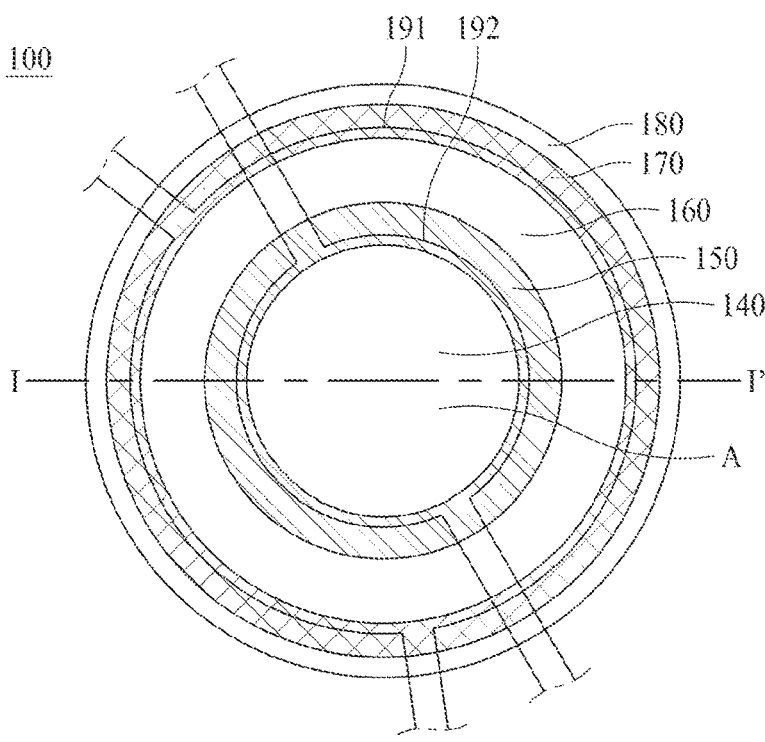
FIG. 1 is a cross-sectional view of a transistor according to an embodiment of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have' and 'include' described in the present disclosure are used, another portion may be added unless 'only~' is used. The terms of a singular form may include plural forms unless referred to the contrary.

In construing an element, the element is construed as including an error band although there is no explicit description.

In describing a position relationship, for example, when the position relationship is described as 'upon~', 'above~', 'below~' and 'next to~', one or more portions may be disposed between two other portions unless 'just' or 'direct' is used.

Spatially relative terms such as "below", "beneath", "lower", "above", and "upper" may be used herein to easily describe a relationship of one element or elements to another element or elements as illustrated in the drawings. It will be understood that these terms are intended to encompass different orientations of the device in addition to the orientation depicted in the drawings. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in a co-dependent relationship.

In the addition of reference numerals to the components of each drawing describing embodiments of the present disclosure, the same components can have the same sign as can be displayed on the other drawings.

In the embodiments of the present disclosure, a source electrode and a drain electrode are distinguished for convenience of description, and the source electrode and the drain electrode may be interchanged. The source electrode may be the drain electrode and vice versa. In addition, the source electrode of any one embodiment may be a drain electrode in another embodiment, and the drain electrode of any one embodiment may be a source electrode in another embodiment.

In some embodiments of the present disclosure, for convenience of description, a source area is distinguished from a source electrode, and a drain area is distinguished from a drain electrode, but embodiments of the present disclosure are not limited thereto. The source area may be the source electrode, and the drain area may be the drain electrode. In addition, the source area may be the drain electrode, and the drain area may be the source electrode.

Figure 2:
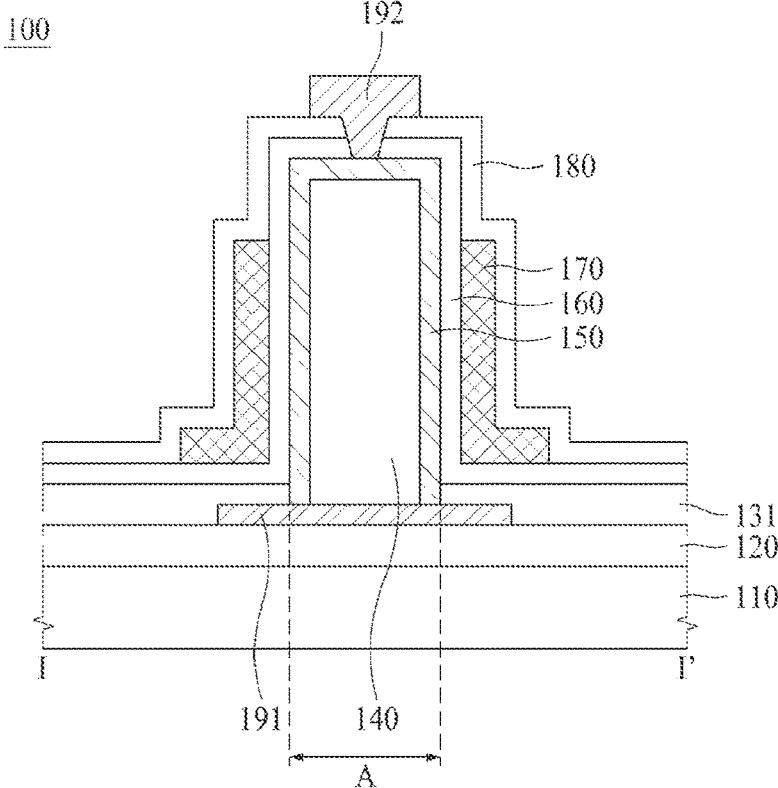
FIG. 2 is a cross-sectional view taken along line I-I' of FIG. 1.

FIG. 1 is a cross-sectional view of a transistor 100 according to an embodiment of the present disclosure. FIG. 2 is a cross-sectional view taken along line I-I' of FIG. 1.

The transistor 100 according to an embodiment of the present disclosure is a vertical channel transistor.

Referring to FIGS. 1 and 2, a transistor 100 according to an embodiment of the present disclosure may include a first electrode 191, a nanorod 140, an active layer 150, a gate insulating layer 160, a gate electrode 170, and a second electrode 192.

Specifically, referring to FIGS. 1 and 2, it includes a first electrode 191, a nanorod 140 on the first electrode 191, an active layer 150 on the nanorod 140, a gate insulating layer 160 on the active layer 150, a gate electrode 170 on the gate insulating layer 160, and a second electrode 192 connected to the active layer 150, and disposed spaced apart from the first electrode 191.

According to an embodiment of the present disclosure, a vertical channel transistor refers to a transistor in which the height of the nanorod 140 is larger than the diameter of the nanorod 140 and a gate voltage is applied by arranging the gate electrode 170 in the transverse direction of the nanorod 140.

The transistor 100 may further include a base substrate 110. Referring to FIG. 2, the first electrode 191 is disposed on the base substrate 110.

The transistor 100 may further include a buffer layer 120. Referring to FIG. 2, the active layer 150 is disposed on the buffer layer 120. Specifically, the buffer layer 120 is disposed between the base substrate 110 and the first insulating layer 131.

Hereinafter, components of the transistor 100 according to an embodiment of the present disclosure will be described in more detail.

Glass or plastic may be used as the base substrate 110. Transparent plastic having flexible properties as plastic, for example, polyimide, may be used.

When polyimide is used as a base substrate 110, heat-resistant polyimide that can withstand high temperatures may be used considering that a high-temperature deposition process is performed on the base substrate 110. In this case, in order to form a thin film transistor, processes such as deposition and etching can be carried out while the polyimide substrate is placed on a carrier substrate made of a high durability material such as glass.

Referring to FIG. 2, a buffer layer 120 may be disposed on the base substrate 110.

The buffer layer 120 is formed on the base substrate 110 and may be formed of an inorganic material or an organic material. For example, insulating oxides such as silicon oxide (SiOx) and aluminum oxide (Al$_2$O$_3$) may be included.

The buffer layer 120 may be formed as a single layer or multiple layers to protect the oxide semiconductor layer 130, planarize an upper part of the base substrate 110, and block impurities such as moisture and oxygen introduced from the base substrate 110.

According to an embodiment of the present disclosure, the first electrode 191 may be disposed on the buffer layer 120. Specifically, FIG. 2 illustrates a configuration in which the first electrode 191 is disposed on the buffer layer 120.

According to an embodiment of the present disclosure, the first electrode 191 and the second electrode 192 may be referred to as a source electrode and a drain electrode, respectively. However, one embodiment of this disclosure is not limited to this, and the first electrode 191 may be referred to as a drain electrode and the second electrode 192 may be referred to as a source electrode.

The first electrode 191 and the second electrode 192 may be spaced apart from each other and connected to the active layer 150, respectively. Referring to FIG. 2, the second electrode 192 is connected to the active layer 150 through a contact hole.

Each of the first electrode 191 and the second electrode 192 may be made of at least one of a metal material, a transparent conductive oxide, and a nitride-based electrode. As a metal material that can be applied to the first electrode 191 and the second electrode 192, it can be molybdenum (Mo), aluminum (Al), chromium (Cr), gold (Au), platinum (Pt), titanium (Ti), nickel (Ni), neodium (Nd), copper (Cu), and alloys of them, as a transparent conductive oxide that can be applied to the first electrode 191 and the second electrode 192, there are IGZO (InGaZnO)-based, ITO (InSnO)-based, FTO (FSnO)-based, and ZO (ZnO)-based, and a nitride-based electrode applicable to the first electrode 191 and the second electrode 192 includes a GN (GaN)-based electrode. In addition, each of the first electrode 191 and the second electrode 192 may be made of a single layer, or may be made of two or more layers.

According to an embodiment of the present disclosure, the first electrode 191 may have a pattern area A. The pattern area A may be defined as an area of the surface of the first electrode 191 that is located on the opposite side of the base substrate 110 and is not covered by the first insulating layer 131, and is surrounded by the first insulating layer 131. The pattern area A will be described in detail below.

According to an embodiment of the present disclosure, the transistor 100 may further include a first insulating layer 131. Referring to FIG. 2, the first insulating layer 131 is disposed on the first electrode 191. Specifically, according to an embodiment of the present disclosure, the first insulating layer 131 may be disposed on a part of the first electrode 191. More specifically, the first insulating layer 131 may overlap at least a part of the first electrode 191, and the first insulating layer 131 that does not overlap the first electrode 191 may be in contact with the buffer layer 120.

According to an embodiment of the present disclosure, the pattern area A may be formed by patterning of the first insulating layer 131. For example, a part of the first insulating layer 131 may be patterned to expose a part of the first electrode 191, and the area exposed from the first insulating layer 131 may be referred to as the pattern area A. For convenience of explanation, an area in which the first insulating layer 131 is patterned and does not overlap the first insulating layer 131 among the first electrodes 191 may be referred to as a pattern area (A). In addition, the pattern area A may be surrounded by the first insulating layer 131.

According to an embodiment of the present disclosure, the first electrode 191 may have a single pattern area A or may have a plurality of pattern areas A. FIG. 2 illustrates a configuration in which the first electrode 191 has one pattern area A. However, one embodiment of the present disclosure is not limited to this, and referring to FIG. 3A, FIG. 3B, and FIG. 4, a configuration in which the first electrode 191 has multiple pattern areas A is illustrated.

Referring to FIG. 2, the first insulating layer 131 may be in contact with the side surface of the first electrode 191.

According to an embodiment of this disclosure, the first insulating layer 131 may contain at least one of silicon oxide (SiOx) and aluminum oxide (Al$_2$O$_3$). The first insulating layer 131 may have a single layer structure or a multilayer layer structure.

According to an embodiment of the present disclosure, the nanorod 140 may be disposed on the first electrode 191. Specifically, FIG. 2 illustrates a configuration in which the nanorod 140 is disposed on the first electrode 191. Specifically, referring to FIG. 2, the nanorod 140 is disposed on the pattern area A of the first electrode 191.

According to an embodiment of this disclosure, the nanorod 140 is deposited by Metal Organic Chemical Vapor Deposition (MOCVD). Specifically, a nanorod 140 having a directionality in a vertical direction with respect to the base substrate 110 may be formed using the MOCVD. Thereafter, zinc (Zn) and oxygen (O) are deposited using the nanorod 140 as seeds, so that the height of the nanorod 140 can be increased. Accordingly, in the present disclosure, the nanorod 140 in which the direction of the crystal is controlled may be formed using the MOCVD method. In addition, the nanorod 140 is selectively deposited only in the pattern area A. For example, metal electrodes act as catalysts in the construction of nanorods 140, while the first insulating layer 131 acts to suppress the growth of nanorods 140. Specifically, referring to FIG. 2, the nanorod 140 is selectively deposited only in the pattern area A, while not in the first insulating layer 131.

Figure 5A:
FIGS. 5A to 5J are process views of a method of manufacturing a transistor according to an embodiment of the present disclosure.
Figure 5B:
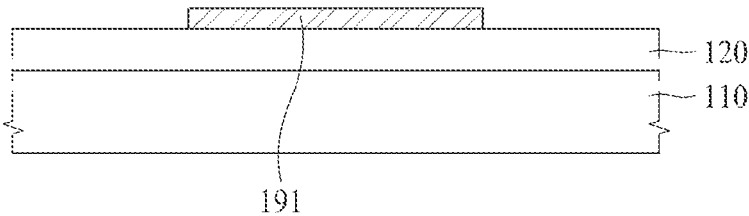
Figure 5C:
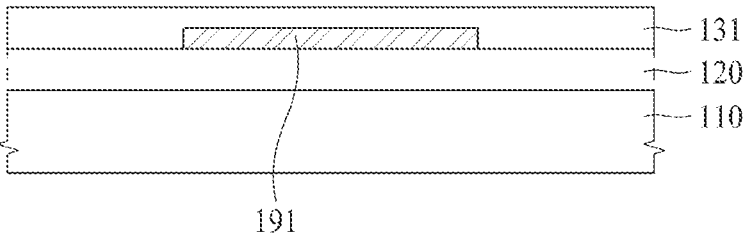
Figure 5D:
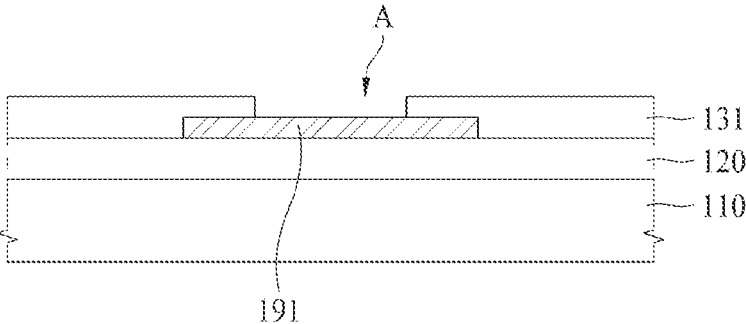
Figure 5E:
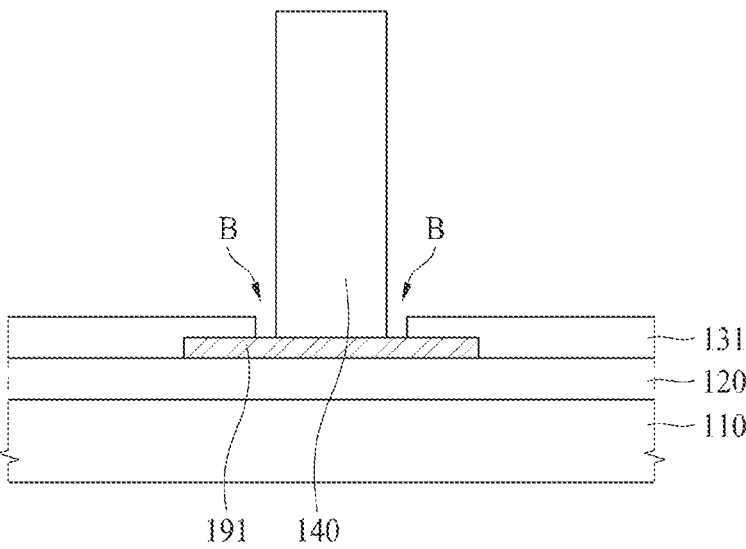

According to an embodiment of this disclosure, when the nanorod 140 is deposited in the pattern area A, there may be an area B separated between the nanorod 140 and the first insulating layer 131 without being deposited in all areas of the pattern area A (see FIG. 5E). In this case, the active layer 150 may be deposited in the spaced region B existing between the nanorod 140 and the first insulating layer 131 (see FIG. 5F).

According to an embodiment of the present disclosure, the nanorod 140 may include at least one of ZnO, GaN, and a mixture including the same. Accordingly, according to an embodiment of the present disclosure, the nanorod 140 may have insulating properties.

According to an embodiment of the present disclosure, the nanorod 140 has a diameter and a height, and the height of the nanorod 140 is larger than the diameter of the nanorod 140. Specifically, referring to FIG. 2, the nanorod 140 may be disposed perpendicular to the base substrate 110. When the nanorod 140 is disposed perpendicular to the base substrate 110, the number of nanorods 140 can be increased to secure a transistor 100 that occupies a small area and flows high current.

According to an embodiment of the present disclosure, the nanorod 140 may have a height in the range of 100 nm to 100 μm.

When the length of the nanorod 140 is greater than 100 μm, the distance between the first electrode 191 and the second electrode 192 may increase, and thus the length of the effective channel may be increased. As a result, the ON current may be reduced, and the driving stability of the transistor 100 may be reduced, and the defect rate may be increased.

On the other hand, when the length of the nanorod 140 is less than 100 nm, the distance between the first electrode 191 and the second electrode (192) may become closer, and the length of the effective channel may be shortened. As a result, the threshold voltage (Vth) may shift in the negative (−) direction, the driving stability of the transistor 100 may decrease, and the defect rate may increase.

According to an embodiment of the present disclosure, the nanorod 140 may have a diameter in the range of 1 nm to 100 μm in a plan view.

When the diameter of the nanorod 140 is greater than 100 μm, the area occupied by one nanorod 140 in a plan view increases. As a result, the area of the channel part of the active layer 150 may be reduced compared to the total area, so that the transistor 100 through which high current flows may not be secured while occupying a small area.

According to an embodiment of the present disclosure, the nanorod 140 may have a cylindrical or prismatic shape. The prism is not limited to a triangular pillar, and a square pillar and other polygonal pillars may be included.

According to an embodiment of the present disclosure, the nanorod 140 is disposed on the first electrode 191. Specifically, the nanorod 140 may be in contact with the first electrode 191.

In addition, the nanorod 140 is disposed to be spaced apart from the first insulating layer 131. Specifically, referring to FIG. 2, the active layer 150 is disposed between the nanorod 140 and the first insulating layer 131.

According to an embodiment of the present disclosure, the active layer 150 may be disposed on the nanorod 140. Specifically, FIG. 2 illustrates a configuration in which the active layer 150 is disposed on the nanorod 140.

According to an embodiment of this disclosure, the active layer 150 may be deposited by atomic layer chemical vapor deposition (ALCVD) or metal organic chemical vapor deposition (MOCVD).

According to an embodiment of the present disclosure, the active layer 150 may be in contact with the top surface and the side surface of the nanorod 140. Specifically, referring to FIG. 2, the active layer 150 may be in contact with an upper surface and a side surface except for a lower surface of the nanorod 140. FIG. 2 illustrates a configuration in which the active layer 150 is in contact with the entire upper surface and the side surface of the nanorod 140. However, one embodiment of this disclosure is not limited to this, and the active layer 150 may not be in contact with at least some of the side surfaces of the nanorod 140. (See FIG. 6)

According to an embodiment of the present disclosure, the active layer 150 may be disposed on a side surface of the nanorod 140 and may be disposed between the nanorod 140 and the first insulating layer 131 to be connected to the first electrode 191.

According to an embodiment of the present disclosure, the active layer 150 may be in contact with at least a part of the first electrode 191. Specifically, referring to FIG. 2, the active layer 150 may be in contact with the first electrode 191 in an area of the pattern area A that does not overlap the nanorod 140.

In addition, according to an embodiment of the present disclosure, the active layer 150 may be formed perpendicular to the base substrate 110. Specifically, referring to FIG.

2, the active layer 150 may be formed vertically on the base substrate 110 like the nanorod 140 in contact with the upper and side surfaces of the nanorod 140.

According to an embodiment of the present disclosure, at least a part of the active layer 150 may be in contact with the first insulating layer 131. A region of the active layer 150 in contact with the first insulating layer 131 may be disposed between the nanorod 140 and the first insulating layer 131.

According to an embodiment of the present disclosure, the active layer 150 includes an oxide semiconductor material. For example, the active layer 150 may include at least one of IZO(InZnO)-based oxide semiconductor material, IGO(InGaO)-based oxide semiconductor material, ITO(In-SnO)-based oxide semiconductor material, IGZO(In-GaZnO)-based oxide semiconductor material, IGZTO(In-GaZnSnO)-based oxide semiconductor material, GZTO (GaZnSnO)-based oxide semiconductor material, GZO (GaZnO)-based oxide semiconductor material, and GO(GaO)-based oxide semiconductor material and ITZO (InSnZnO)-based oxide semiconductor material. However, one embodiment of present disclosure is not limited to this, and the active layer 150 may be made by other oxide semiconductor materials known in the art.

According to an embodiment of the present disclosure, the gate insulating layer 160 may be disposed on the active layer 150. Specifically, FIG. 2 illustrates a configuration in which the gate insulating layer 160 is disposed on the active layer 150.

According to an embodiment of the present disclosure, the gate insulating layer 160 may be in contact with the top surface and the side surface of the active layer 150. Specifically, referring to FIG. 2, the gate insulating layer 160 may be in contact with an area of the active layer 150 except for a contact hole by the second electrode 192 and an area in contact with the first insulating layer 131.

In addition, the gate insulating layer 160 is disposed to be spaced apart from the first electrode 191. Specifically, referring to FIG. 2, the first insulating layer 131 is disposed between the first electrode 191 and the gate insulating layer 160.

According to an embodiment of the present disclosure, the gate insulating layer 160 may be in contact with at least a part of the first insulating layer 131. Specifically, referring to FIG. 2, the first insulating layer 131 may be disposed between the buffer layer 120 and the gate insulating layer 160.

The gate insulating layer 160 may include at least one of silicon oxide, silicon nitride, and metal oxide. The gate insulating layer 160 may have a single layer structure or a multilayer layer structure.

According to an embodiment of the present disclosure, the gate electrode 170 may be disposed on the gate insulating layer 160. Specifically, FIG. 2 illustrates a configuration in which the gate electrode 170 is disposed on the gate insulating layer 160.

The gate electrode 170 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). Although not shown, the gate electrode 170 may have a multi-layered structure that includes two conductive layers having their respective physical properties different from each other.

According to an embodiment of the present disclosure, the gate electrode 170 may cover the nanorod 140. Specifically, referring to FIG. 1, the gate electrode 170 may surround the nanorod 140 while contacting the gate insulating layer 160 in a plan view.

The transistor 100 may further include an interlayer insulating layer 180. Specifically, referring to FIGS. 1 and 2, an interlayer insulating layer 180 may be disposed on the gate electrode 170.

The interlayer insulating layer 180 is an insulating layer made of an insulating material. Specifically, the interlayer insulating layer 180 may be made of an organic material, an inorganic material, or a laminate of an organic material layer and an inorganic material layer.

According to an embodiment of the present disclosure, the second electrode 192 may be disposed on the interlayer insulating layer 180. Specifically, FIG. 2 illustrates a configuration in which an interlayer insulating layer 180 is disposed between the gate electrode 170 and the second electrode 192.

According to an embodiment of the present disclosure, the first electrode 191 and the second electrode 192 may be referred to as a source electrode and a drain electrode, respectively. However, one embodiment of this disclosure is not limited to this, and the first electrode 191 may be referred to as a drain electrode and the second electrode 192 may be referred to as a source electrode. The second electrode 192 has already been described in the first electrode 191, and overlapping contents will be omitted.

Figure 3A:
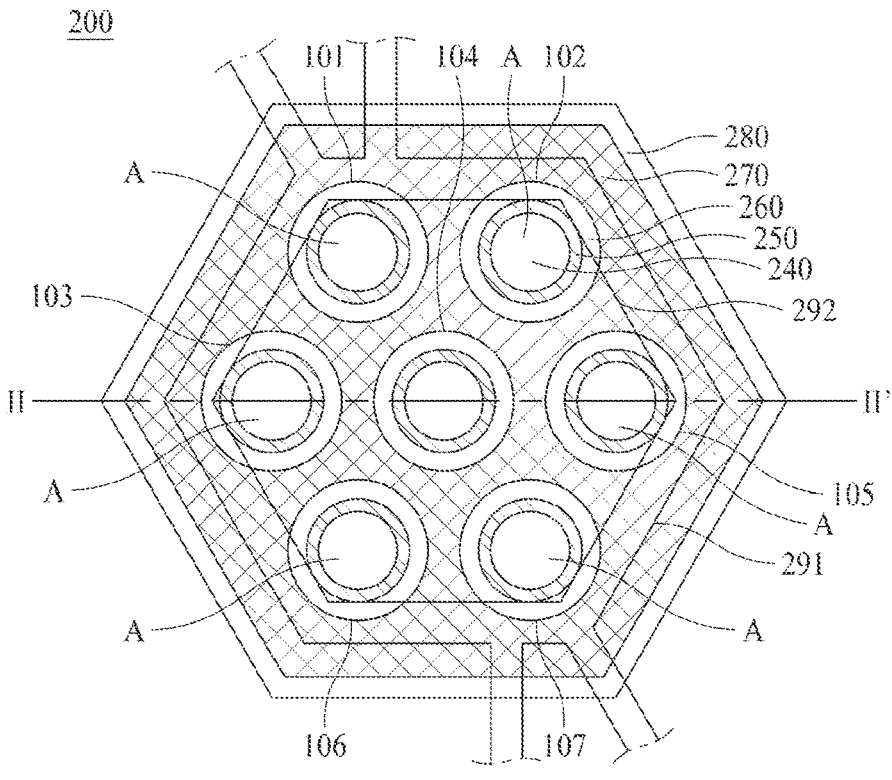
FIG. 3A is a cross-sectional view of a transistor according to still another embodiment of the present disclosure.
Figure 3B:
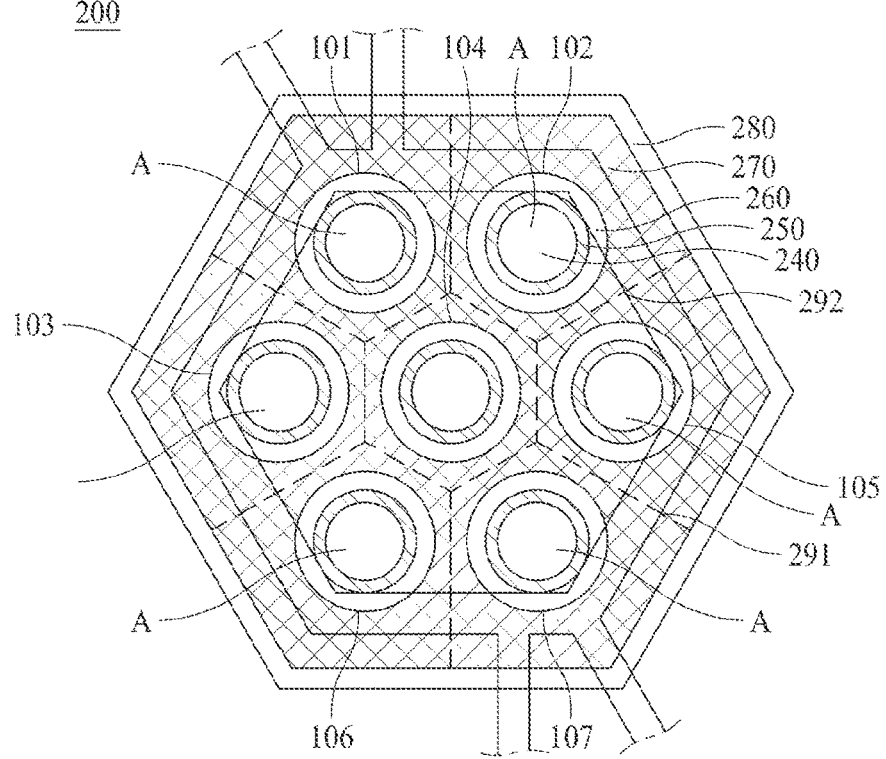
FIG. 3B is a cross-sectional view of a transistor according to still another embodiment of the present disclosure.

FIGS. 3A and 3B are cross-sectional views of a transistor 200 according to another embodiment of the present disclosure.

Figure 4:
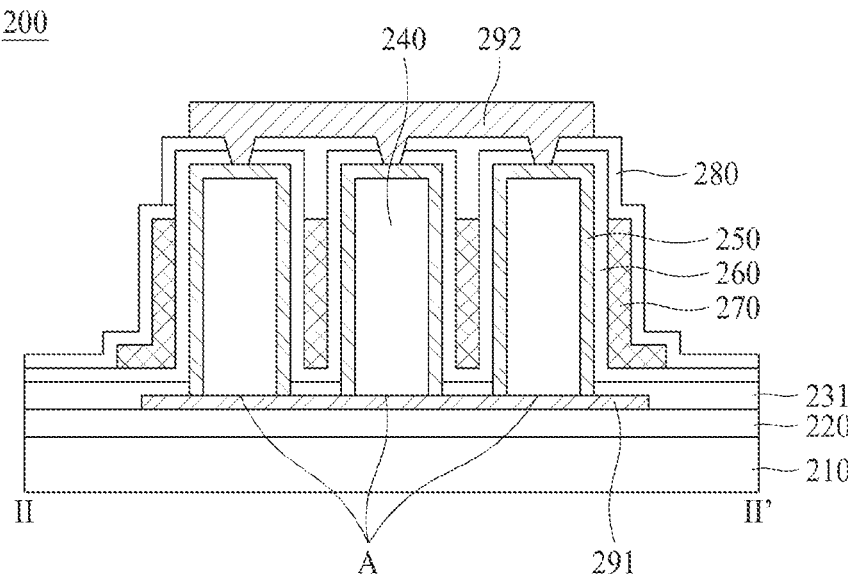
FIG. 4 is a cross-sectional view taken along line II-II' of FIG. 3A.

FIG. 4 is a cross-sectional view taken along line II-II' of FIG. 3A.

Referring to FIGS. 3A, 3B, and 4, compared to FIGS. 1 and 2, the transistor 200 according to an embodiment of the present disclosure may have a plurality of pattern regions A.

According to an embodiment of the present disclosure, the nanorod 240 is deposited in the pattern region A. As a result, the transistor 200 having a plurality of pattern regions A may have a plurality of nanorods 240.

According to an embodiment of the present disclosure, the transistor 200 may include a plurality of sub-transistors 101, 102, 103, 104, 105, 106, and 107. Each of the sub-transistors 101, 102, 103, 104, 105, 106, 107 includes a first electrode 291, a nanorod 240 on the first electrode 291, an active layer 250 on the nanorod 240, a gate insulating layer 260 on the active layer 250, a gate electrode 270 on gate insulating layer 260, and a second electrode 292 connected to the active layer 250 disposed spaced apart from the first electrode 291.

Referring to FIGS. 3A, 3B, and 4, sub-transistors 101, 102, 103, 104, 105, 106, and 107 are connected to the same first electrode 291 and second electrode 292. Specifically, the first electrode 291 and the second electrode 292 are integrated, and each sub-transistor 101, 102, 103, 104, 105, 106, 107 may be connected to the second electrode 292 through each contact hole.

In addition, the sub-transistors 101, 102, 103, 104, 105, 106, and 107 may include the same gate electrode 270. Specifically, referring to FIG. 3A, FIG. 3B, and FIG. 4, the gate electrode 270 is integrated, and the same gate voltage is applied to each sub-transistor 101, 102, 103, 104, 105, 106, 107 through the gate electrode 270.

Referring to FIG. 3B, the first electrode 291, the second electrode 292, and the gate electrode 270 are integrally formed, but the active layer 250 is separated by the nanorod 240, and the sub-transistors 101, 102, 103, 105, 106, and 107 may be classified around each of the separated active layers 250.

If the transistor 200 has multiple sub-transistors 101, 102, 103, 104, 105, 106, 107, the area of the channel part of the active layer 250 may increase, and the amount of current flowing through the transistor 200 may increase. As a result, a high current transistor 200 may be secured. According to an embodiment of the present disclosure, a high current transistor refers to a transistor 200 that allows a large amount of current to flow through the transistor 200.

According to an embodiment of this disclosure, since each sub-transistor 101, 102, 103, 104, 105, 106, 107 occupies a small area, even if the transistor 200 includes a plurality of sub-transistors 101, 102, 103, 104, 105, 106, 107, the area of the transistor 200 may not be significantly increased. As a result, even if the area of the transistor 200 is not greatly increased, the amount of current flowing through the transistor 200 may be greatly increased.

In addition, when the transistor 200 has multiple sub-transistors 101, 102, 103, 104, 105, 106, 107, it is possible to slim the display 1000, improve the opening rate of the display 1000, and reduce the manufacturing cost of the display 1000.

Hereinafter, a method of manufacturing the transistor 100 according to an embodiment of the present disclosure will be described with reference to FIGS. 5A to 5J.

FIGS. 5A to 5J are process views of a method of manufacturing a transistor 100 according to an embodiment of the present disclosure.

Referring to FIG. 5A, a base substrate 110 is prepared, and a buffer layer 120 is formed on the base substrate 110.

Referring to FIG. 5B, a first electrode 191 is formed on the buffer layer 120.

Referring to FIG. 5C, a first insulating layer 131 is formed on the first electrode 191. The first insulating layer 131 may be formed on the entire surface of the base substrate 110. In addition, the first insulating layer 131 may include at least one of silicon oxide (SiOx) and aluminum oxide ($Al_2O_3$).

Referring to FIG. 5D, the first electrode 191 is exposed by patterning of the first insulating layer 131. In this case, the area of the first electrode 191 exposed from the first insulating layer 131 by the patterning of the first insulating layer 131 is referred to as the pattern area A. The nanorod 140 may be deposited on the pattern region A.

Referring to FIG. 5E, a nanorod 140 is formed on the pattern region A of the first electrode 191. When the nanorod 140 is formed on the pattern area A of the first electrode 191, there may be a gap between the nanorod 140 and the first insulating layer 131. In this case, the active layer 150 may be deposited through a gap between the nanorod 140 and the first insulating layer 131.

According to an embodiment of this disclosure, the nanorod 140 is deposited by Metal Organic Chemical Vapor Deposition (MOCVD). Specifically, a nanorod 140 having a directionality in a vertical direction with respect to the base substrate 110 may be formed using the MOCVD. Thereafter, zinc (Zn) and oxygen (O) are deposited using the nanorod 140 as seeds, so that the height of the nanorod 140 can be increased. Accordingly, in the present disclosure, the nanorod 140 in which the direction of the crystal is controlled may be formed using the MOCVD method. In addition, the nanorod 140 is selectively deposited only in the pattern area A.

According to an embodiment of the present disclosure, the nanorod 140 may include at least one of ZnO, GaN, and a mixture including the same. Accordingly, according to an embodiment of the present disclosure, the nanorod 140 may have insulating properties.

Figure 5F:
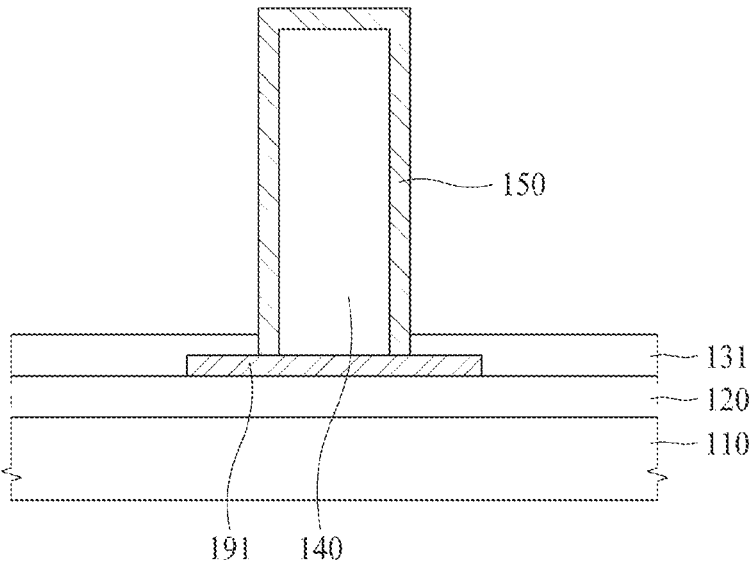

Referring to FIG. 5F, an active layer 150 is formed on the nanorod 140. According to an embodiment of this disclosure, the active layer 150 may be deposited by atomic layer chemical vapor deposition (ALCVD) or metal organic chemical vapor deposition (MOCVD).

According to an embodiment of the present disclosure, the active layer 150 may be disposed on a side surface of the nanorod 140 and may be disposed between the nanorod 140 and the first insulating layer 131 to be connected to the first electrode 191.

According to an embodiment of the present disclosure, the active layer 150 may be in contact with at least a part of the first electrode 191. Specifically, the active layer 150 may be in contact with the first electrode 191 in a region of the pattern area A that does not overlap the nanorod 140.

According to an embodiment of the present disclosure, the active layer 150 includes an oxide semiconductor material. For example, the active layer 150 may include at least one of IZO(InZnO)-based oxide semiconductor material, IGO(InGaO)-based oxide semiconductor material, ITO(In-SnO)-based oxide semiconductor material, IGZO(In-GaZnO)-based oxide semiconductor material, IGZTO(In-GaZnSnO)-based oxide semiconductor material, GZTO (GaZnSnO)-based oxide semiconductor material, GZO (GaZnO)-based oxide semiconductor material, and GO(GaO)-based oxide semiconductor material and ITZO (InSnZnO)-based oxide semiconductor material. However, one embodiment of present disclosure is not limited to this, and the active layer 150 may be made by other oxide semiconductor materials known in the art.

Figure 5G:
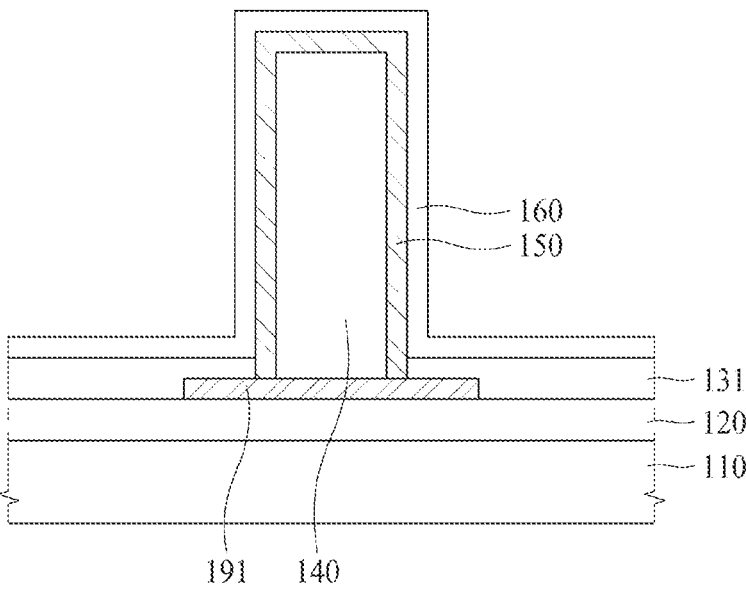

Referring to FIG. 5G, a gate insulating layer 160 is formed on the active layer 150.

According to an embodiment of the present disclosure, the gate insulating layer 160 may be in contact with the top surface and the side surface of the active layer 150. Specifically, the gate insulating layer 160 may be in contact with an area of the active layer 150 except for a contact hole by the second electrode 192 and an area in contact with the first insulating layer 131.

Figure 5H:
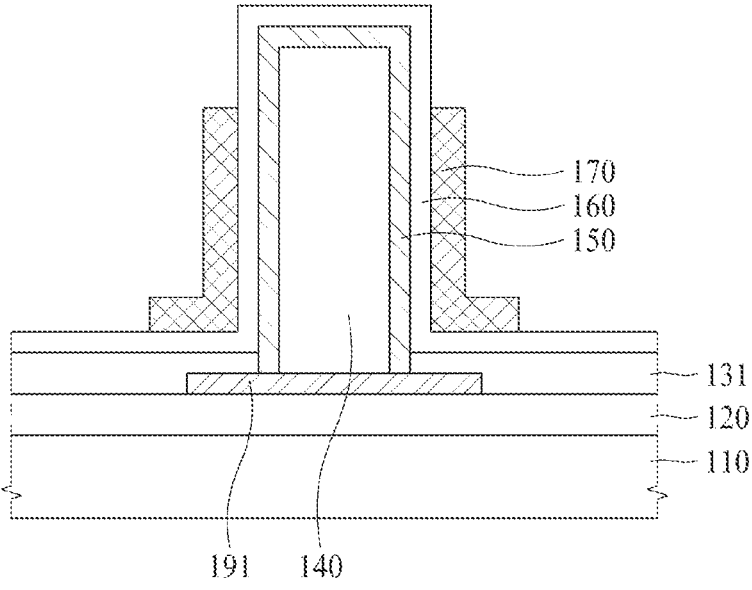

Referring to FIG. 5H, a gate electrode 170 is formed on the gate insulating layer 160.

According to an embodiment of the present disclosure, the gate electrode 170 may cover the nanorod 140. Specifically, the gate electrode 170 may surround the nanorod 140 while contacting the gate insulating layer 160 in a plan view.

Figure 5I:
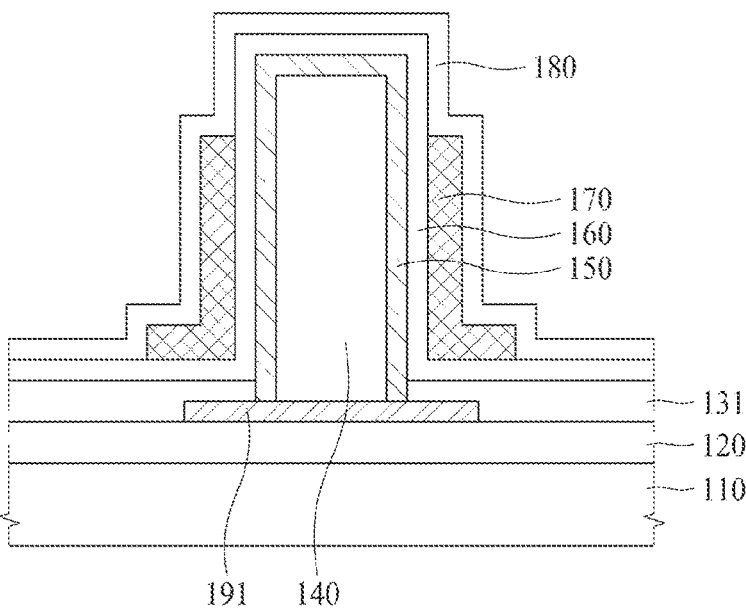

Referring to FIG. 5I, an interlayer insulating layer 180 is formed on the gate electrode 170.

Figure 5J:
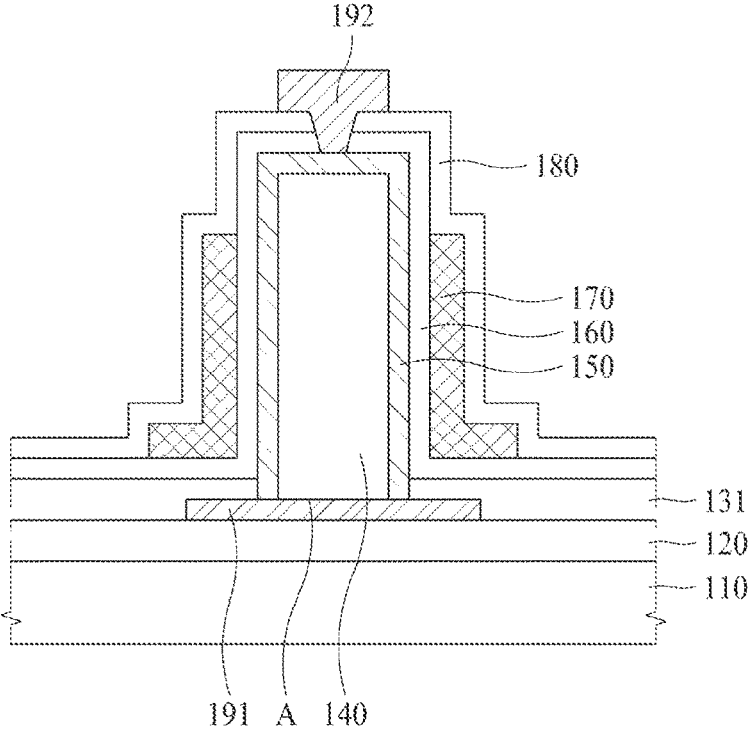

Referring to FIG. 5J, a second electrode 192 is formed on the interlayer insulating layer 180.

According to an embodiment of the present disclosure, the first electrode 191 and the second electrode 192 may be spaced apart from each other and connected to the active layer 150, respectively.

Figure 6:
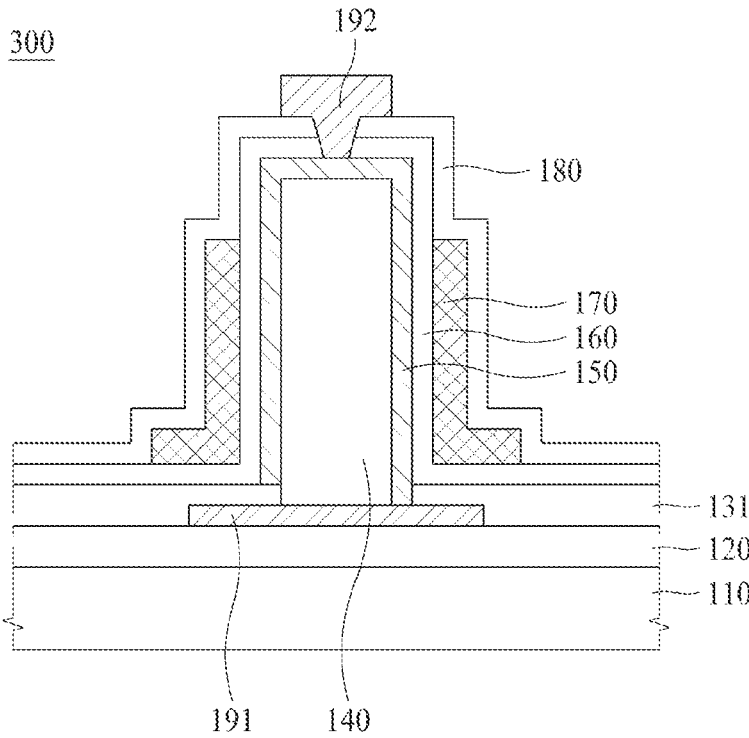
FIG. 6 is a cross-sectional view of a transistor according to still another embodiment of the present disclosure.

FIG. 6 is a cross-sectional view of a transistor 300 according to another embodiment of the present disclosure.

In FIG. 6, compared with FIG. 2, the first insulating layer 131 may not be spaced apart from the nanorod 140. Specifically, at least a part of the first insulating layer 131 may be in contact with a side surface of the nanorod 140. FIG. 6 illustrates a configuration in which the first insulating layer 131 is in contact with the side surface of the nanorod 140. In addition, the active layer 150 may not be in contact with at least a part of the side surfaces of the nanorod 140.

Figure 7:
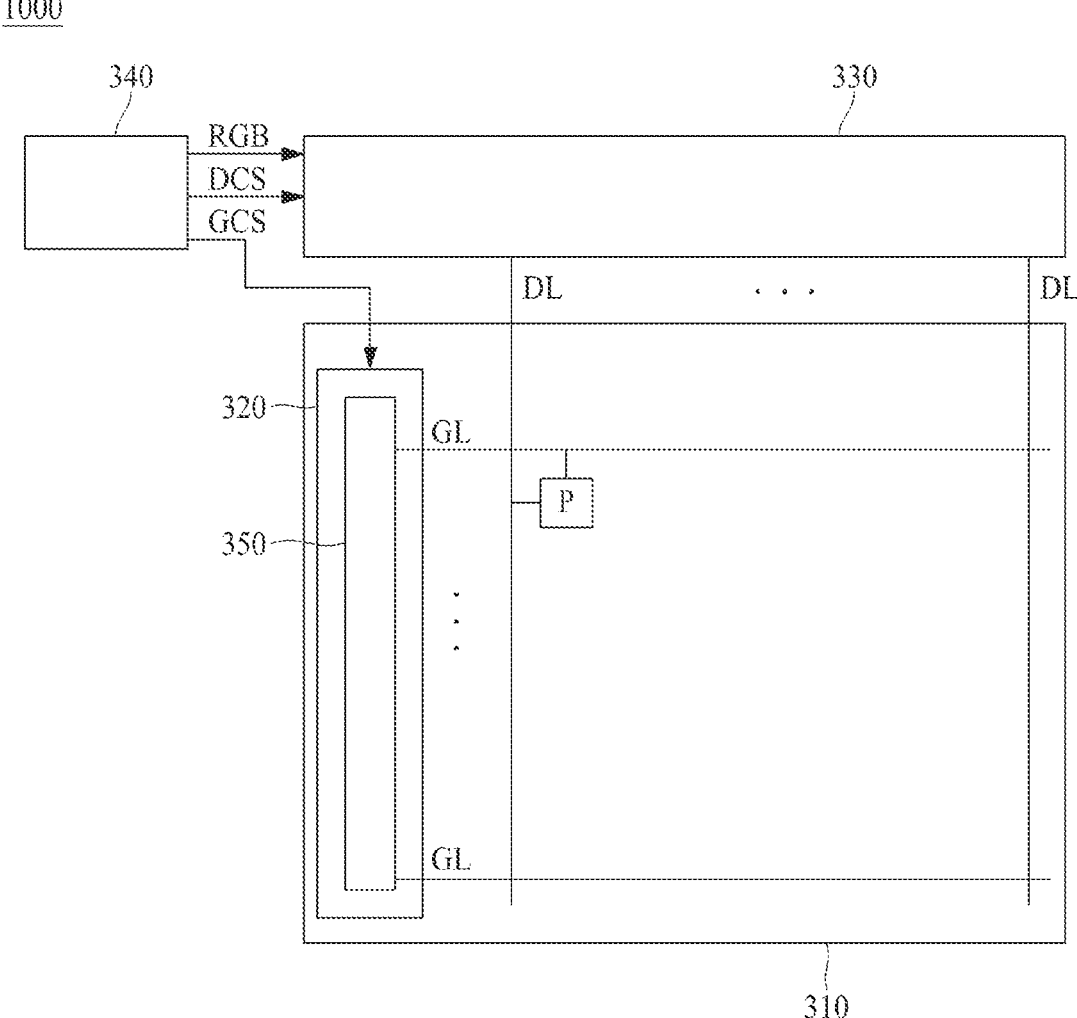
FIG. 7 is a schematic diagram of a display apparatus according to an embodiment of the present disclosure.

FIG. 7 is a schematic view illustrating a display apparatus 1000 according to further still another embodiment of the present disclosure.

As shown in FIG. 7, the display apparatus 1000 according to further still another embodiment of the present disclosure may include a display panel 310, a gate driver 320, a data driver 330 and a controller 340.

The display panel 310 includes gate lines GL and data lines DL, and pixels P are disposed in intersection areas of the gate lines GL and the data lines DL. An image is displayed by driving of the pixels P. The gate lines GL, the data lines DL and the pixels P may be disposed on the base substrate 110.

The controller 340 controls the gate driver 320 and the data driver 330.

The controller 340 outputs a gate control signal GCS for controlling the gate driver 320 and a data control signal DCS for controlling the data driver 330 by using a signal supplied from an external system not shown. Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage and supplies the data voltage to the data lines DL.

According to one embodiment of the present disclosure, the gate driver 320 may be packaged on the display panel 310. In this way, a structure in which the gate driver 320 is directly packaged on the display panel 310 will be referred to as a Gate In Panel (GIP) structure. In detail, in the Gate In Panel (GIP) structure, the gate driver 320 may be disposed on the base substrate 110.

The display apparatus 1000 according to one embodiment of the present disclosure may include the above-described transistors 100 and 200.

The gate driver 320 may include a shift register 350.

The shift register 350 sequentially supplies gate pulses to the gate lines GL for one frame by using the start signal and the gate clock, which are transmitted from the controller 340. In this case, one frame means a time period at which one image is output through the display panel 310. The gate pulse has a turn-on voltage capable of turning on a switching device (thin film transistor) disposed in the pixel P.

Also, the shift register 350 supplies a gate-off signal capable of turning off the switching device, to the gate line GL for the other period of one frame, at which the gate pulse is not supplied. Hereinafter, the gate pulse and the gate-off signal will be collectively referred to as a scan signal SS or Scan.

Figure 8:
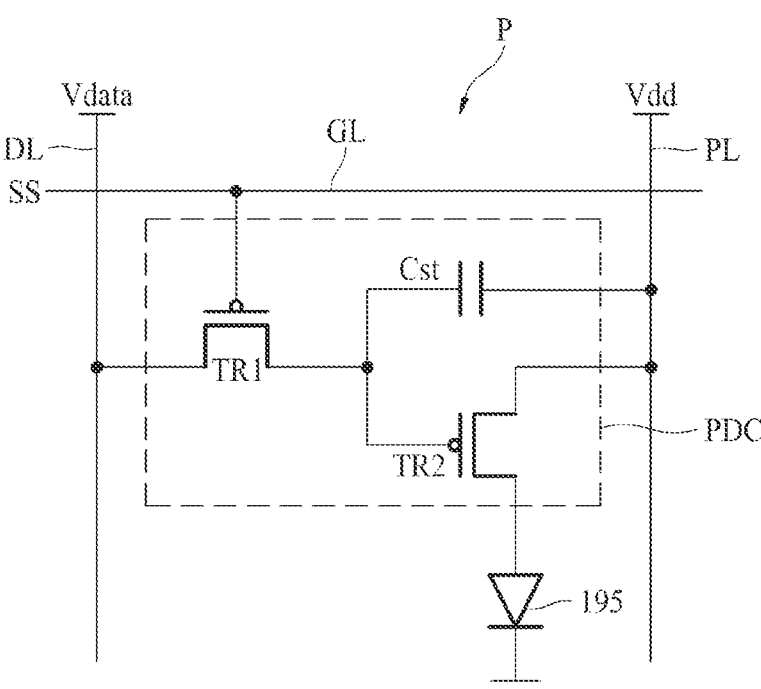
FIG. 8 is a circuit view of any one pixel of FIG. 7.

FIG. 8 is a circuit view illustrating any one pixel P of FIG. 7.

The circuit view of FIG. 8 is an equivalent circuit view for the pixel P of the display apparatus 1000 that includes a light emitting device 195.

Referring to FIG. 8, the pixel P includes a light emitting device 195 and a pixel driving circuit PDC for driving a light emitting device 195. In detail, the display apparatus 1000 according to one embodiment of the present disclosure may include a pixel driving circuit PDC on the base substrate 110.

The pixel driving circuit PDC of FIG. 8 includes a first transistor TR1 that has at least one of sub-transistors 101, 102, 103, 104, 105, 106, 107 and a second transistor TR2 that is electrically connected to the first transistor and has at least one of sub-transistors 101, 102, 103, 104, 105, 106, 107. Also, in the circuit view for any one pixel P of the display apparatus 1000 according to further still another embodiment of the present disclosure, which is shown in FIG. 7, the first transistor TR1 corresponds to the transistor 100 and 300 of FIGS. 1, 2 and 6 and the second transistor TR2 corresponds to the transistor 200 of FIGS. 3A, 3B and 4 as compared with the transistor 100, 200 and 300 shown in FIGS. 1 to 4 and 6.

In this case, each of the sub-transistors 101, 102, 103, 104, 105, 106, 107 includes a first electrode 191 and a nanorod 140 on the first electrode 191, an active layer 150 on the nanorod 140, a gate insulating layer 160 on the active layer 150, gate electrode 170 on the gate insulating layer 160 and a second electrode 192 connected to the active layer 150 and disposed spaced apart from the first electrode 191.

According to an embodiment of the present disclosure, the first transistor TR1 is a switching transistor, and the second transistor TR2 is a driving transistor. Specifically, the second transistor TR2, which is a driving transistor, needs to have better mobility and current characteristics than the first transistor TR1, which is a switching transistor. Accordingly, according to an embodiment of the present disclosure, the second transistor TR2 may have a larger number of sub-transistors than the first transistor TR1.

If the second transistor TR2 has a larger number of sub-transistors 101, 102, 103, 104, 105, 106, 107 than the first transistor TR1, the second transistor TR2 has high current characteristics and can be useful as a driving transistor of the display 1000. In addition, the first transistor TR1 has low current characteristics and can be useful as a switching transistor for the display apparatus 1000.

The first transistor TR1 is connected to the gate line GL and the data line DL, and is turned on or off by the scan signal SS supplied through the gate line GL.

The data line DL provides a data voltage Vdata to the pixel driving circuit PDC, and the first transistor TR1 controls applying of the data voltage Vdata.

The driving power line PL provides a driving voltage Vdd to the display apparatus 710, and the first transistor TR1 controls the driving voltage Vdd. The driving voltage Vdd is a pixel driving voltage for driving the light emitting device 195 that is the display apparatus 710.

When the first transistor TR1 is turned on by the scan signal SS applied from the gate driver 320 through the gate line GL, the data voltage Vdata supplied through the data line DL is supplied to a gate electrode of the second transistor TR2 connected to the light emitting device 195. The data voltage Vdata is charged in a storage capacitor Cst formed between the gate electrode and a source electrode of the second transistor TR2.

The amount of a current supplied to the light emitting diode (LED), which is the light emitting device 195, through the second transistor TR2 is controlled in accordance with the data voltage Vdata, whereby a gray scale of light output from the light emitting device 195 may be controlled.

According to an embodiment of the present disclosure, the light emitting device 195 is an inorganic light emitting diode.

The light emitting device 195 according to an embodiment of the present disclosure is connected to the p-type electrode line 203 and the n-type electrode line 204.

The p-type electrode line 203 and the n-type electrode line 204 have excellent electrical conductivity. The p-type electrode line 203 and the n-type electrode line 204 may include at least one of copper (Cu), aluminum (Al), silver (Ag), magnesium (Mg), platinum (Pt), palladium (Pd), gold (Au), nickel (Ni), neodium (Nd), iridium (Ir), chromium (Cr), lithium (Li), and calcium (Ca). The p-type electrode line 203 and the n-type electrode line 204 may have a single-layer structure or a structure in which a plurality of layers is stacked.

According to an embodiment of this disclosure, the light emitting device 195 includes an n-type electrode 198, an n-type semiconductor layer 197c connected to the n-type electrode 198, an active layer 197b connected to the n-type semiconductor layer 197c, *p*-type semiconductor layer 197a connected to the active layer 197b and a p-type electrode 196 connected to p-type semiconductor layer 197a.

According to an embodiment of the present disclosure, the n-type semiconductor layer 197c and the p-type semiconductor layer 197a may include gallium nitride (GaN). For example, as the light emitting device 195, a gallium nitride (GaN)-based diode may be used. More specifically, a Ti/Al layer, a Cr/Au layer, a Cr/Au layer, or a Ni/Au layer is used as an n-type electrode (198), a n-type GaN layer is used as a n-type semiconductor layer 197c, an InGaN active layer is used as an active layer 197b, a p-type GaN layer is used as a p-type semiconductor layer (197a), and a p-type reflective layer electrode may be used as a p-type electrode (196).

According to an embodiment of the present disclosure, the light emitting device 195 may emit blue light, may emit green light or red light, and may emit light of other colors such as white. According to an embodiment of the present disclosure, light generated in the light emitting device 195 may be emitted to the outside of the light emitting device 195 through the n-type GaN layer, which is the n-type semiconductor layer 197c.

Figure 9:
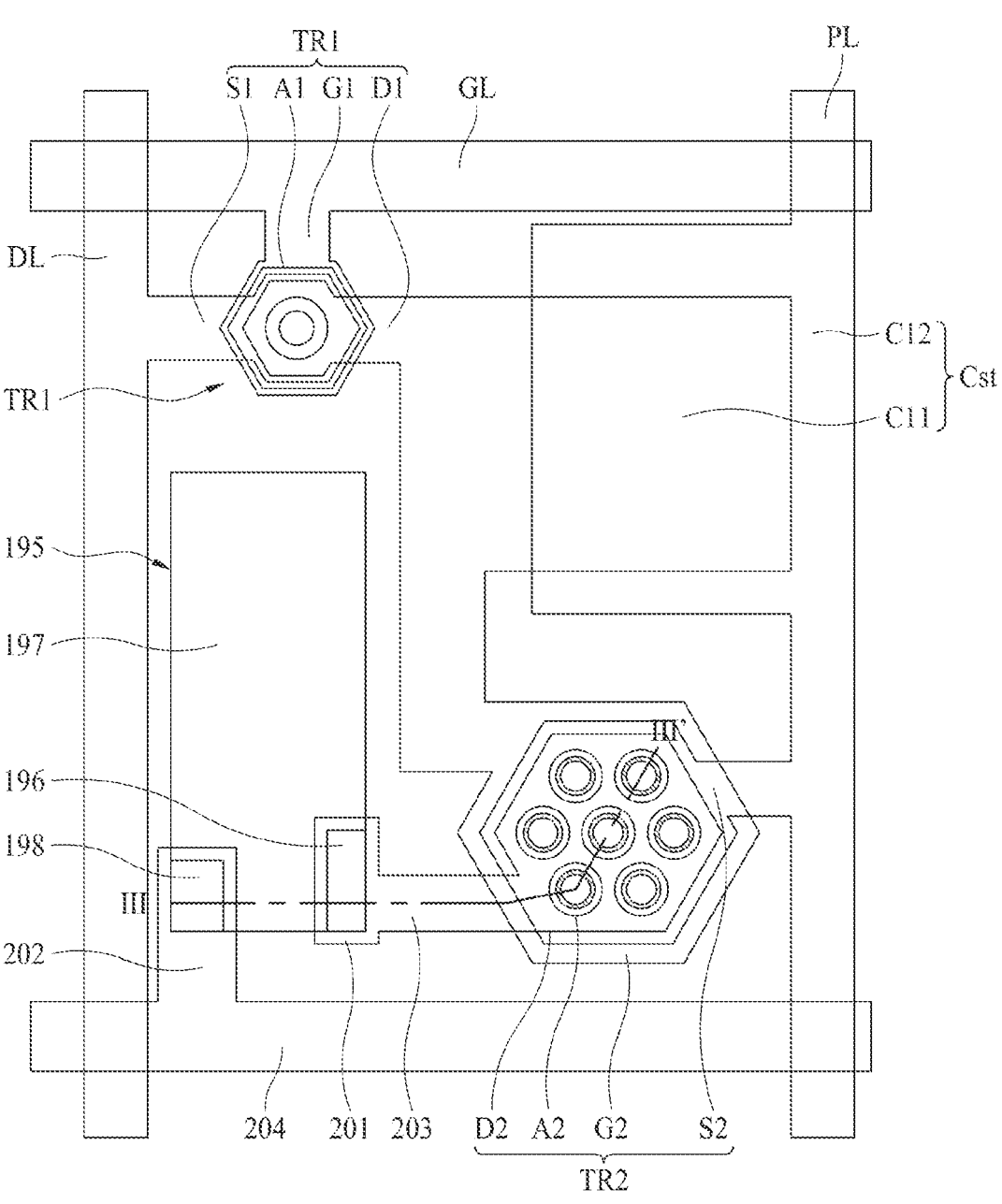
FIG. 9 is a plan view of a pixel of FIG. 8.

FIG. 9 is a plan view of a pixel of FIG. 8.

Referring to FIG. 9, the p-type electrode 196 may be connected to the p-type electrode line 203, and the n-type electrode 198 may be connected to the n-type electrode line 204. More specifically, the light emitting device 195 may further include an n-type pad 202 connected to the n-type electrode 198 and a p-type pad 201 connected to the p-type electrode 196. Accordingly, the n-type electrode 198 may be connected to the n-type electrode line 204 through the n-type pad 202, and the p-type electrode 196 may be connected to the p-type electrode line 203 through the p-type pad 201.

Figure 10:
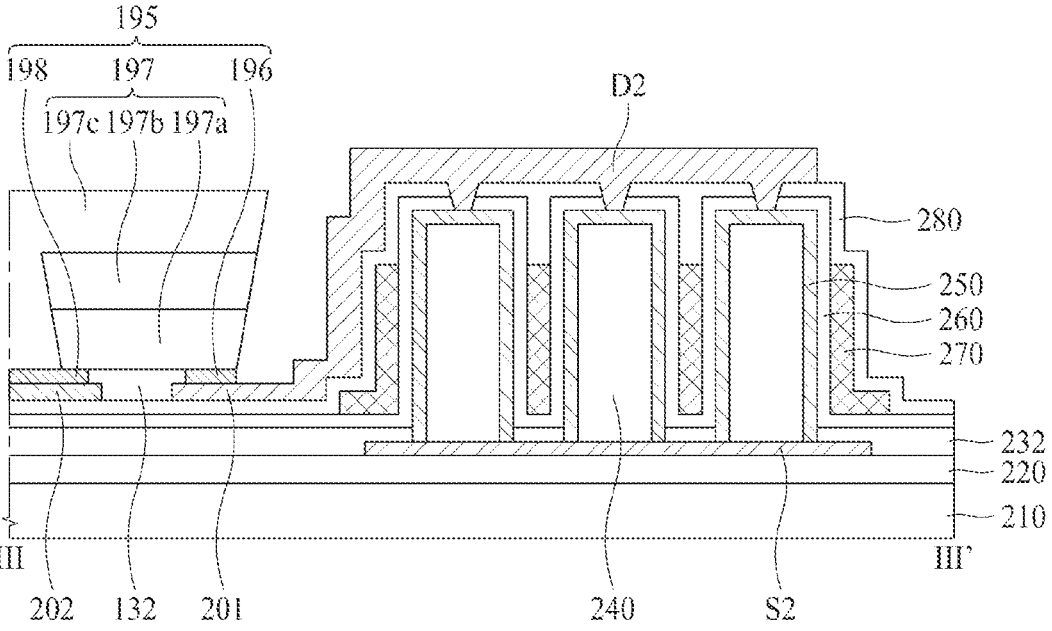
FIG. 10 is a cross-sectional view taken along line I-III' of FIG. 9.

According to an embodiment of the present disclosure, a part of the drain electrode D2 of the second transistor TR2 may be extended to form a p-type electrode line 203. FIG. 10 is a cross-sectional view taken along line I-III' of FIG. 9.

The display apparatus 1000 according to an embodiment of the present disclosure may include a second insulating layer 132 disposed on the drain electrode D2 and in contact with the light emitting device 195. Referring to FIG. 10, a second insulating layer 132 disposed on the drain electrode D2 and in contact with the light emitting device 195 is illustrated. In this case, the source electrodes S1 and S2 according to FIG. 9 and FIG. 10 correspond to the first electrode 191 according to FIG. 2, and the drain electrodes D1 and D2 according to FIG. 9 and FIG. 10 correspond to the second electrode 192 according to FIG. 2.

The second insulating layer 132 may be formed of an organic material or an inorganic material. The second insulating layer 132 may be formed of a single layer or may have a structure in which a plurality of layers is stacked. The second insulating layer 132 may have insulating properties, and the second insulating layer 132 serves to fix the light emitting device 195.

The second insulating layer 132 may be made of a polymer resin having insulating properties and adhesiveness. Specifically, the second insulating layer 132 includes an adhesive polymer resin. The second insulating layer 132 may contain at least one of polyacrylic, polyurethane, polycarbonate, polyimide, polyamide, and polystyrene, for example. However, the material for forming the second insulating layer 132 is not limited thereto, and other polymer resins having insulation and adhesion may be used to form the second insulating layer 132.

Figure 11:
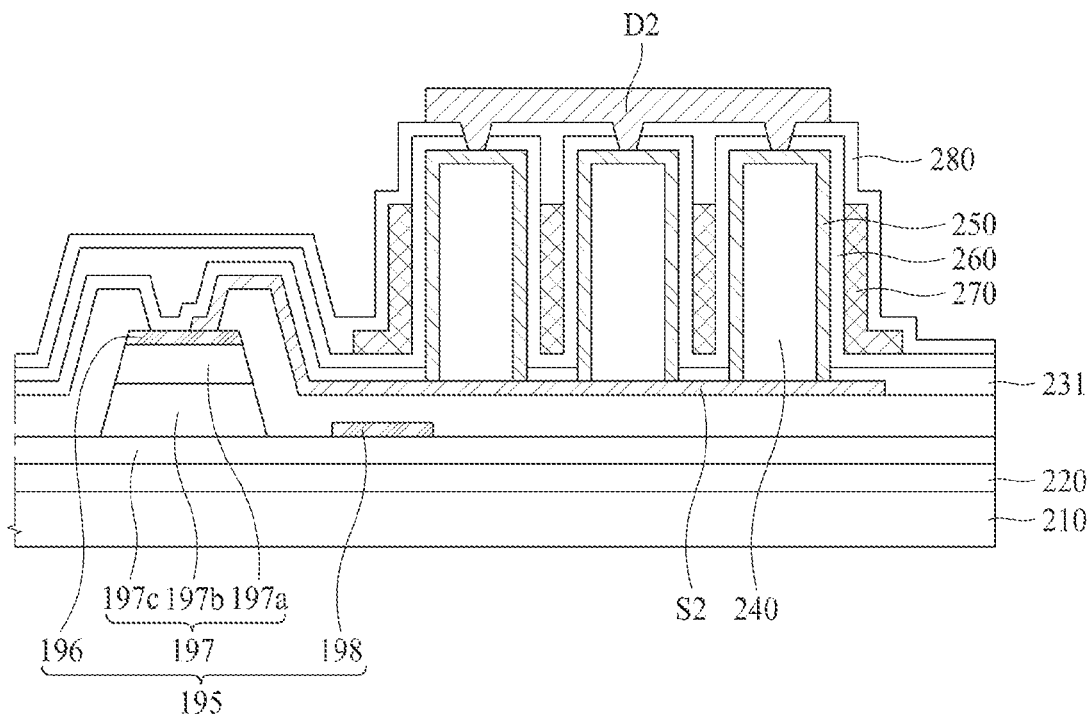
FIG. 11 is a cross-sectional view of a display apparatus according to another embodiment.

FIG. 11 is a cross-sectional view of a display apparatus according to another embodiment.

In FIG. 11, compared with FIG. 10, a light emitting device 195 is disposed between the base substrate 210 and the source electrode S2. Specifically, the n-type semiconductor layer 197c of the light emitting device 195 is disposed between the active layer 197b and the base substrate 210. In this case, the source electrode S2 according to FIG. 11 corresponds to the first electrode 191 according to FIG. 2, and the drain electrode D2 according to FIG. 11 corresponds to the second electrode 192 according to FIG. 2.

Figure 12:
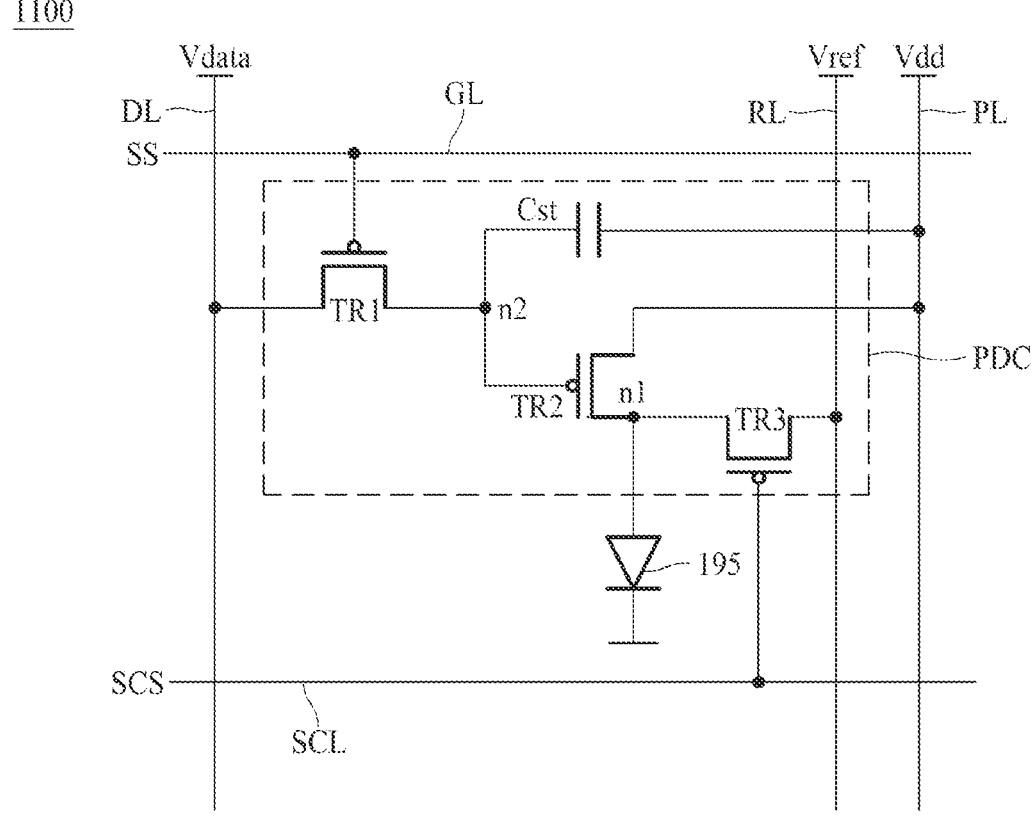
FIG. 12 is a circuit view of any one pixel of a display apparatus according to another embodiment of the present disclosure.

FIG. 12 is a circuit diagram of any one pixel of the display apparatus 1100 according to another embodiment of the present disclosure.

FIG. 12 is an equivalent circuit view of the pixel P of the display apparatus 1100.

The pixel P of the display apparatus 1100 shown in FIG. 12 includes a light emitting device 195 and a pixel driving circuit PDC that drives the light emitting device 195. The light emitting device 195 is connected to the pixel driving circuit PDC.

In the pixel P, signal lines DL, GL, PL, RL, and SCL that supply signals to the pixel driving circuit PDC are arranged.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

The pixel driving circuit PDC includes, for example, a first transistor TR1 (switching transistor) connected with the gate line GL and the data line DL, a second transistor TR2 (driving transistor) for controlling a magnitude of a current output to the light emitting device 195 in accordance with the data voltage Vdata transmitted through the first transistor TR1, and a third transistor TR3 (sensing transistor) for sensing characteristics of the second transistor TR2.

The first transistor TR1 is turned on by the scan signal SS supplied to the gate line GL to transmit the data voltage Vdata, which is supplied to the data line DL, to the gate electrode of the second transistor TR2.

The third transistor TR3 is connected to a first node n1 between the second transistor TR2 and the display apparatus 710 and the reference line RL, and thus is turned on or off by the sensing control signal SCS and senses characteristics of the second transistor TR2, which is a driving transistor, for a sensing period.

A second node n2 connected with the gate electrode of the second transistor TR2 is connected with the first transistor TR1. A storage capacitor Cst is formed between the second node n2 and the first node n1.

When the first transistor TR1 is turned on, the data voltage Vdata supplied through the data line DL is supplied to the gate electrode of the second transistor TR2. The data voltage Vdata is charged in the storage capacitor Cst formed between the gate electrode and the source electrode of the second transistor TR2.

When the second transistor TR2 is turned on, the current is supplied to the light emitting device 195 through the second transistor TR2 in accordance with the driving voltage Vdd for driving the pixel, whereby light is output from the light emitting device 195.

The display apparatus 1100 according to still another embodiment of the present disclosure may include at least one of transistors 100 and 200.

The pixel driving circuit PDC of FIG. 12 includes a first transistor TR1 that has at least one of sub-transistors 101, 102, 103, 104, 105, 107 and a second transistor TR2 that is electrically connected to the first transistor and has at least one of sub-transistors 101, 102, 103, 104, 105, 107. Also, in the circuit view for anyone pixel P of the display apparatus 1100 according to further still another embodiment of the present disclosure, which is shown in FIG. 12, the first transistor TR1 corresponds to the transistor 100 and 300 of FIGS. 1, 2 and 6 and the second transistor TR2 corresponds to the transistor 200 of FIGS. 3A, 3B and 4 as compared with the transistor 100, 200 and 300 shown in FIGS. 1 to 4 and 6.

The pixel driving circuit PDC according to still another embodiment of the present disclosure may be formed in various structures in addition to the above-described structure. The pixel driving circuit PDC may include, for example, four or more transistors.

According to the present disclosure, the following advantageous effects may be obtained.

Since the transistor according to an embodiment of the present disclosure includes a nanorod, high current may flow while occupying a small area.

The transistor according to an embodiment of the present disclosure may adjust the amount of current flowing through the transistor by adjusting the number of nanorods. As a result, by adjusting the number of nanorods, various transistors suitable for use may be designed.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A transistor comprising:

a first electrode;

a nanorod on the first electrode;

an active layer on the nanorod;

a gate insulating layer on the active layer;

a gate electrode on the gate insulating layer;

a second electrode connected to the active layer and disposed spaced apart from the first electrode; and a first insulating layer disposed on a part of the first electrode, wherein:

the first electrode has a pattern area, the nanorod is disposed on the pattern area, the nanorod has a diameter and a height, the height of the nanorod is greater than the diameter of the nanorod, the active layer is disposed on a side surface of the nanorod, and connected to the first electrode, the active layer is disposed between the nanorod and the first insulating layer, and the first electrode and the first insulating layer do not overlap each other in the pattern area.

2. The transistor of claim 1, wherein the first insulating layer overlaps at least a part of the first electrode.

3. The transistor of claim 1, wherein the nanorod is in contact with the first electrode in the pattern area, and the nanorod is spaced apart from the first insulating layer.

4. The transistor of claim 1, wherein the active layer is in contact with a top surface and a side surface of the nanorod.

5. The transistor of claim 1, wherein the active layer is in contact with at least a part of the first electrode.

6. The transistor of claim 1, wherein the gate insulating layer is in contact with at least a part of the first insulating layer.

7. The transistor of claim 1, wherein the first electrode has a plurality of the pattern areas defined by the first insulating layer.

8. The transistor of claim 1, wherein the first insulating layer contains at least one of silicon oxide (SiOx) and aluminum oxide ($Al_2O_3$).

9. The transistor of claim 1, wherein the nanorod includes at least one of ZnO, GaN, and a mixture including the same.

10. The transistor of claim 1, wherein the nanorod has a height in the range of 100 nm to 100 μm.

11. The transistor of claim 1, wherein the nanorod has a cylindrical or prismatic shape, and the nanorod has a diameter in the range of 1 nm to 100 μm in a plan view.

12. The transistor of claim 1, wherein the nanorod has insulating property.

13. The transistor of claim 1, wherein the active layer includes an oxide semiconductor material.

14. A display apparatus comprising:

a first transistor having at least one of sub-transistor;

a second transistor that is electrically connected to the first transistor and has a plurality of sub-transistors; and a light emitting device connected to the second transistor;

wherein each of the sub-transistors comprises:

a first electrode;

a nanorod on the first electrode;

an active layer on the nanorod;

a gate insulating layer on the active layer;

a gate electrode on the gate insulating layer;

a second electrode connected to the active layer, and disposed spaced apart from the first electrode; and a first insulating layer disposed on a part of the first electrode, wherein:

the first electrode has a pattern area, the nanorod is disposed on the pattern area, the active layer is disposed on a side surface of the nanorod, and connected to the first electrode, the active layer is disposed between the nanorod and the first insulating layer, and the first electrode and the first insulating layer do not overlap each other in the pattern area.

15. The display apparatus of claim 14, wherein the first transistor is a switching transistor, and the second transistor is a driving transistor.

16. The display apparatus of claim 14, wherein the second transistor has a larger number of sub-transistors than the first transistor.

17. The display apparatus of claim 14, the light emitting device is an inorganic light emitting diode.

18. The display apparatus of claim 14, wherein the light emitting device comprises:

a n-type electrode;

a n-type semiconductor layer connected to the n-type electrode;

an active layer connected to the n-type semiconductor layer;

a p-type semiconductor layer connected to the active layer; and a p-type electrode connected to the p-type semiconductor layer.

19. The display apparatus of claim 14, further comprising a second insulating layer disposed on the second electrode, and in contact with the light emitting device, wherein the second insulating layer includes an adhesive polymer resin.

* * * * *